(12) United States Patent
Akahane

(10) Patent No.: US 11,784,636 B2
(45) Date of Patent: Oct. 10, 2023

(54) COMPARATOR CIRCUIT AND SEMICONDUCTOR DEVICE

(71) Applicant: FUJI ELECTRIC CO., LTD., Kawasaki (JP)

(72) Inventor: Masashi Akahane, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/535,336

(22) Filed: Nov. 24, 2021

(65) Prior Publication Data

US 2022/0085798 A1 Mar. 17, 2022

Related U.S. Application Data

(63) Continuation of application No. PCT/JP2020/040385, filed on Oct. 28, 2020.

(30) Foreign Application Priority Data

Dec. 3, 2019 (JP) ................................ 2019-218974

(51) Int. Cl.
*H03K 3/3565* (2006.01)
*H03K 5/24* (2006.01)
(Continued)

(52) U.S. Cl.
CPC ..... *H03K 3/3565* (2013.01); *G01R 19/16538* (2013.01); *H03K 5/2481* (2013.01); *H03K 17/687* (2013.01)

(58) Field of Classification Search
None
See application file for complete search history.

(56) References Cited

U.S. PATENT DOCUMENTS 3,984,703 A * 10/1976 Jorgensen ............ H03K 3/3565
327/206
4,464,587 A * 8/1984 Suzuki ................. H03K 3/3565
327/206
(Continued)

FOREIGN PATENT DOCUMENTS

JP H06-53783 A 2/1994
JP H10-209823 A 8/1998
(Continued)

OTHER PUBLICATIONS

International Search Report for PCT/JP2020/040385, dated Jan. 26, 2021.
(Continued)

*Primary Examiner* — Kenneth B Wells
(74) *Attorney, Agent, or Firm* — Rabin & Berdo, P.C.

(57) ABSTRACT

A comparator circuit configured to output an output voltage at a first logic level, upon an input voltage exceeding a first threshold voltage, and output the output voltage at a second logic level, upon the input voltage dropping below a second threshold voltage lower than the first threshold voltage. The comparator circuit includes a converter circuit configured to convert the input voltage of the comparator circuit into a first voltage and a second voltage lower than the first voltage, and a logic circuit configured to output a voltage, as the output voltage of the comparator circuit, that is at the first logic level, upon the first voltage exceeding a third threshold voltage, and at the second logic level, upon the second voltage dropping below a fourth threshold voltage lower than the third threshold voltage.

8 Claims, 8 Drawing Sheets

(51) Int. Cl.
    *H03K 17/687*     (2006.01)
    *G01R 19/165*     (2006.01)

(56) References Cited

U.S. PATENT DOCUMENTS

| | | | | |
|---|---|---|---|---|
| 4,563,594 A * | 1/1986 | Koyama | H03K 3/3565 | 327/206 |
| 5,194,767 A * | 3/1993 | Chao | H03K 3/3565 | 326/70 |
| 5,319,323 A * | 6/1994 | Fong | H03K 3/0231 | 331/111 |
| 5,336,942 A * | 8/1994 | Khayat | H03K 3/011 | 327/206 |
| 5,341,033 A * | 8/1994 | Koker | H03K 3/013 | 327/384 |
| 5,602,496 A * | 2/1997 | Mahmood | H03K 3/3565 | 326/71 |
| 5,640,118 A * | 6/1997 | Drouot | G05F 3/24 | 327/309 |
| 5,874,844 A * | 2/1999 | Shin | H03K 3/3565 | 327/333 |
| 5,945,859 A | 8/1999 | Pang | | |
| 6,046,617 A * | 4/2000 | Hoeld | H03K 3/356165 | 327/206 |
| 6,060,924 A * | 5/2000 | Sugano | G01R 31/318586 | 327/213 |
| 6,060,925 A * | 5/2000 | Chou | H03K 3/3565 | 327/210 |
| 6,124,733 A * | 9/2000 | Sharpe-Geisler | H03K 3/3565 | 327/108 |
| 6,127,898 A * | 10/2000 | Naura | H03K 3/354 | 327/264 |
| 6,181,172 B1 * | 1/2001 | Callahan | H03K 3/3565 | 327/437 |
| 6,356,099 B1 * | 3/2002 | Lee | H03K 3/3565 | 326/24 |
| 6,433,602 B1 * | 8/2002 | Lall | H03K 3/3565 | 327/205 |
| 6,441,663 B1 * | 8/2002 | Chuang | H03K 3/3565 | 327/206 |
| 6,448,830 B1 * | 9/2002 | Chuang | H03K 3/3565 | 327/205 |
| 6,549,048 B2 * | 4/2003 | Tailliet | H03K 3/3565 | 327/205 |
| 6,624,678 B1 * | 9/2003 | Boutaud | H03K 3/0375 | 327/206 |
| 6,690,222 B2 * | 2/2004 | Nair | H03K 3/012 | 327/205 |
| 6,700,424 B2 * | 3/2004 | Feng | H03K 17/223 | 327/108 |
| 6,870,413 B1 * | 3/2005 | Chang | H03K 3/3565 | 327/205 |
| 7,167,032 B1 * | 1/2007 | Barlow | H03K 3/011 | 327/205 |
| 7,183,826 B2 * | 2/2007 | Hashimoto | H03K 3/0377 | 327/205 |
| 7,268,604 B2 * | 9/2007 | Koo | H03K 5/2481 | 327/206 |
| 7,368,976 B2 * | 5/2008 | Gupta | H03K 19/00384 | 327/544 |
| 7,764,101 B2 * | 7/2010 | Wu | H03K 3/3565 | 327/205 |
| 7,940,083 B2 * | 5/2011 | Yamashita | H03K 19/018528 | 326/85 |
| 8,115,531 B1 * | 2/2012 | Brown | H03K 3/35625 | 327/202 |
| 8,497,701 B2 * | 7/2013 | Clerc | H03K 19/00338 | 326/27 |
| 8,723,584 B2 * | 5/2014 | Larsen | H03K 19/00361 | 327/333 |
| 8,736,333 B1 * | 5/2014 | Tercariol | H03K 3/3565 | 327/205 |
| 8,829,964 B1 * | 9/2014 | Williams | H03K 3/011 | 327/206 |
| 9,306,550 B2 * | 4/2016 | Kumar | H03K 3/3565 | |
| 9,496,874 B2 * | 11/2016 | Kim | H03K 19/018521 | |
| 9,584,101 B2 * | 2/2017 | Li | H03K 3/3565 | |
| 9,673,788 B2 * | 6/2017 | Zhao | H03K 3/012 | |
| 10,355,676 B2 * | 7/2019 | Sugahara | G11C 11/412 | |
| 10,483,973 B2 * | 11/2019 | Chen | H03K 19/00384 | |
| 10,622,979 B2 * | 4/2020 | Jiang | H03K 5/1252 | |
| 10,756,735 B2 * | 8/2020 | Chen | H03K 3/356113 | |
| 10,811,085 B2 * | 10/2020 | Lin | G11C 5/147 | |
| 11,146,253 B1 * | 10/2021 | Jeon | H03K 19/0013 | |
| 11,171,634 B2 * | 11/2021 | Chen | H03K 3/0377 | |
| 11,190,187 B2 * | 11/2021 | Chen | H03K 3/356113 | |
| 11,223,345 B2 * | 1/2022 | Kumar | H03K 3/3565 | |
| 11,296,683 B2 * | 4/2022 | Narawade | H03K 3/356104 | |
| 11,444,611 B2 * | 9/2022 | Ma | H03K 17/6874 | |
| 2006/0082392 A1 | 4/2006 | Koo | | |
| 2018/0167063 A1 | 6/2018 | Akahane | | |

FOREIGN PATENT DOCUMENTS

| | | |
|---|---|---|
| JP | 2002-300011 A | 10/2002 |
| JP | 2012-238986 A | 12/2012 |
| JP | 2017-169153 A | 9/2017 |
| WO | 2017141559 A1 | 8/2017 |

OTHER PUBLICATIONS

Japanese Office Action dated Jul. 18, 2023, in the counterpart Japanese Patent Application No. 2021-562500.

* cited by examiner

COMPARATOR CIRCUIT AND SEMICONDUCTOR DEVICE

CROSS-REFERENCE TO RELATED APPLICATIONS

This is a continuation application of International Patent Application No. PCT/JP2020/040385 filed Oct. 28, 2020, which claims the benefit of priority to Japanese Patent Application No. 2019-218974 filed Dec. 3, 2019, the entire contents of each of which the entire contents of each of which are incorporated herein by reference.

BACKGROUND

Technical Field

The present disclosure relates to a comparator circuit and a semiconductor device.

Description of the Related Art

A comparator circuit using a Schmitt trigger circuit with hysteresis characteristics is commonly used as a circuit for detecting a logic signal (e.g., Japanese Patent Application Publication No. H6-53783).

There are hysteresis comparators using differential comparators as described below, and their hysteresis characteristics are adjustable (Japanese Patent Application Publication Nos. 2002-300011 and H10-209823).

Incidentally, when, for example, a Schmitt trigger circuit as in Japanese Patent Application Publication No. H6-53783 is used as a comparator circuit, the hysteresis characteristics are determined by threshold voltages of MOS transistors in the Schmitt trigger circuit and are difficult to be changed.

In addition, a hysteresis comparator as in Japanese Patent Application Publication Nos. 2002-300011 or H10-209823 needs to use a differential comparator, and thus a bias current constantly flows during the operation of comparison, resulting in a large power consumption. Furthermore, the comparator itself needs a large area.

The present disclosure is directed to provision of a comparator circuit capable of changing the hysteresis characteristics.

SUMMARY

A first aspect of an embodiment of the present disclosure is a comparator circuit configured to output an output voltage at a first logic level, upon an input voltage exceeding a first threshold voltage, and output the output voltage at a second logic level, upon the input voltage dropping below a second threshold voltage lower than the first threshold voltage, the comparator circuit comprising: a converter circuit configured to convert the input voltage of the comparator circuit into a first voltage and a second voltage lower than the first voltage; and a logic circuit configured to output an voltage, as the output voltage of the comparator circuit, that is at the first logic level, upon the first voltage exceeding a third threshold voltage, and at the second logic level, upon the second voltage dropping below a fourth threshold voltage lower than the third threshold voltage.

A second aspect of an embodiment of the present disclosure is a semiconductor device for a power module including an upper-arm switching device and a lower-arm switching device, the semiconductor device comprising: a power supply circuit configured to generate, from a power supply voltage, a low power supply voltage lower than the power supply voltage; a detection circuit configured to operate at the low power supply voltage and to receive a control signal for driving the upper-arm switching device and the lower-arm switching device; and a driver circuit configured to drive the upper-arm switching device and the lower-arm switching device in response to a result of detection of the detection circuit, wherein the detection circuit includes a comparator circuit configured to output the result of detection at a first logic level, upon a voltage level of the control signal exceeding a first threshold voltage, and output the result of detection at a second logic level, upon the voltage level of the control signal dropping below a second threshold voltage lower than the first threshold voltage, the comparator circuit including a converter circuit configured to convert the voltage level of the control signal into a first voltage and a second voltage lower than the first voltage, and a logic circuit configured to output a voltage, as the result of detection, that is at the first logic level, upon the first voltage exceeding a third threshold voltage, and at the second logic level, upon the second voltage dropping below a fourth threshold voltage lower than the third threshold voltage.

DETAILED DESCRIPTION

At least following matters will become apparent from the descriptions of the present specification and the accompanying drawings.

Embodiments

<Power Module 10>

Figure 1:
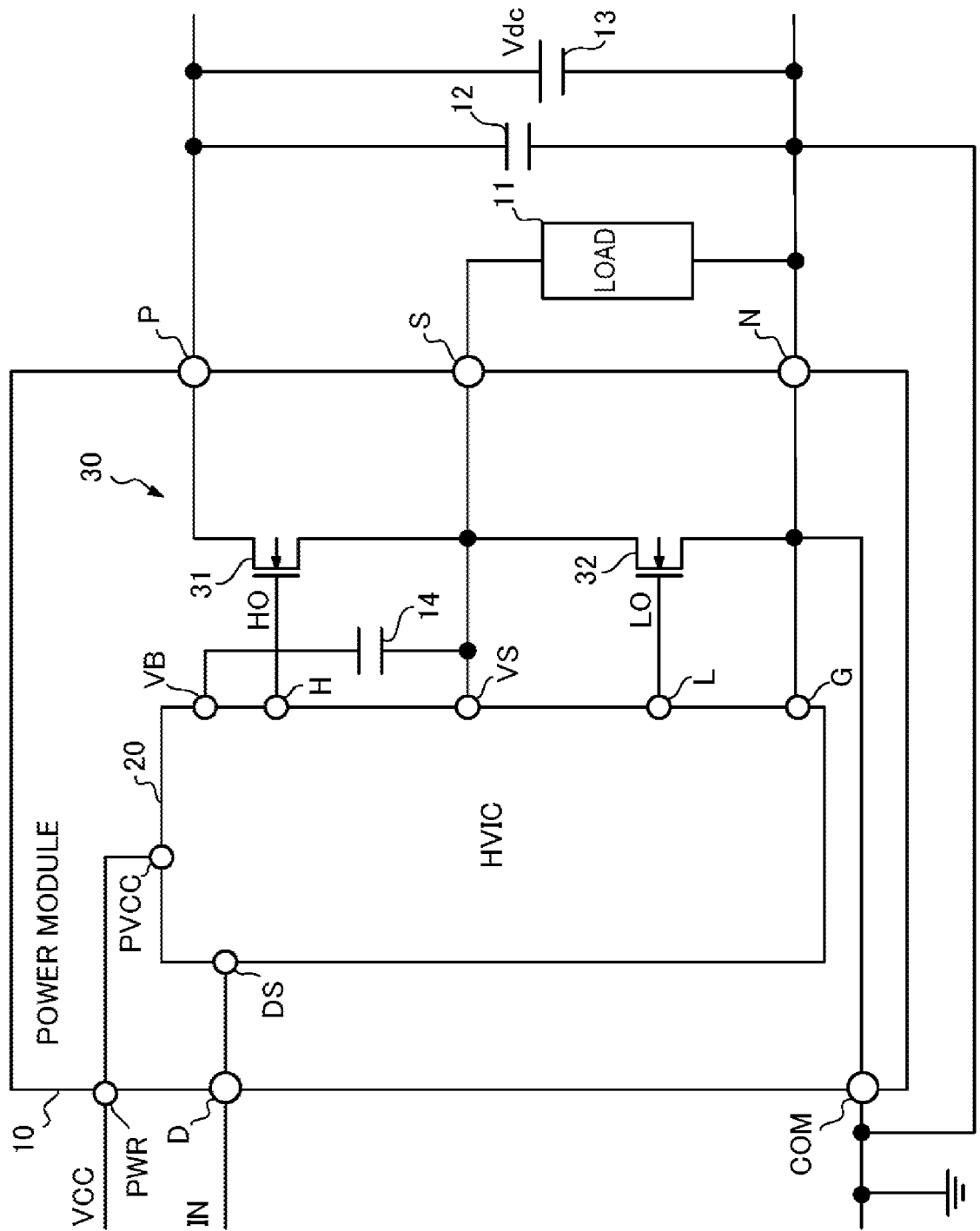
FIG. 1 is a diagram illustrating an example of a configuration of a power module 10.

FIG. 1 is a diagram illustrating an example of a configuration of a power module 10 which is one embodiment of the present disclosure. The power module 10 is a semiconductor device that includes a power semiconductor for power conversion and a driver circuit, and drives, for example, a load 11. The power module 10 includes a capacitor 14 to generate a boot strap voltage Vb, a High Voltage Integrated Circuit (HVIC) 20, abridge circuit 30, and terminals PWR, D, P, S, N, and COM.

A power supply voltage VCC is applied to the terminal PWR, and a control signal IN from an MCU (microcontroller unit; not illustrated) is inputted to the terminal D. The load 11 is coupled between the terminal S and the terminal N. A power supply voltage Vdc is applied to the terminal P, and a capacitor 12 to stabilize the power supply voltage Vdc is coupled between the terminal P and the terminal N.

Upon receipt of the control signal IN from the MCU (not illustrated), the HVIC 20 outputs drive signals HO, LO to the bridge circuit 30 to drive the bridge circuit 30.

In response to the drive signals HO, LO from the HVIC 20, the bridge circuit 30 drives the load 11 (e.g., an inductor). The bridge circuit 30 includes N-channel metal-oxide-semiconductor (NMOS) transistors 31, 32. Note that the NMOS transistors 31, 32 correspond to "switching devices."

<HVIC 20>

Figure 2:
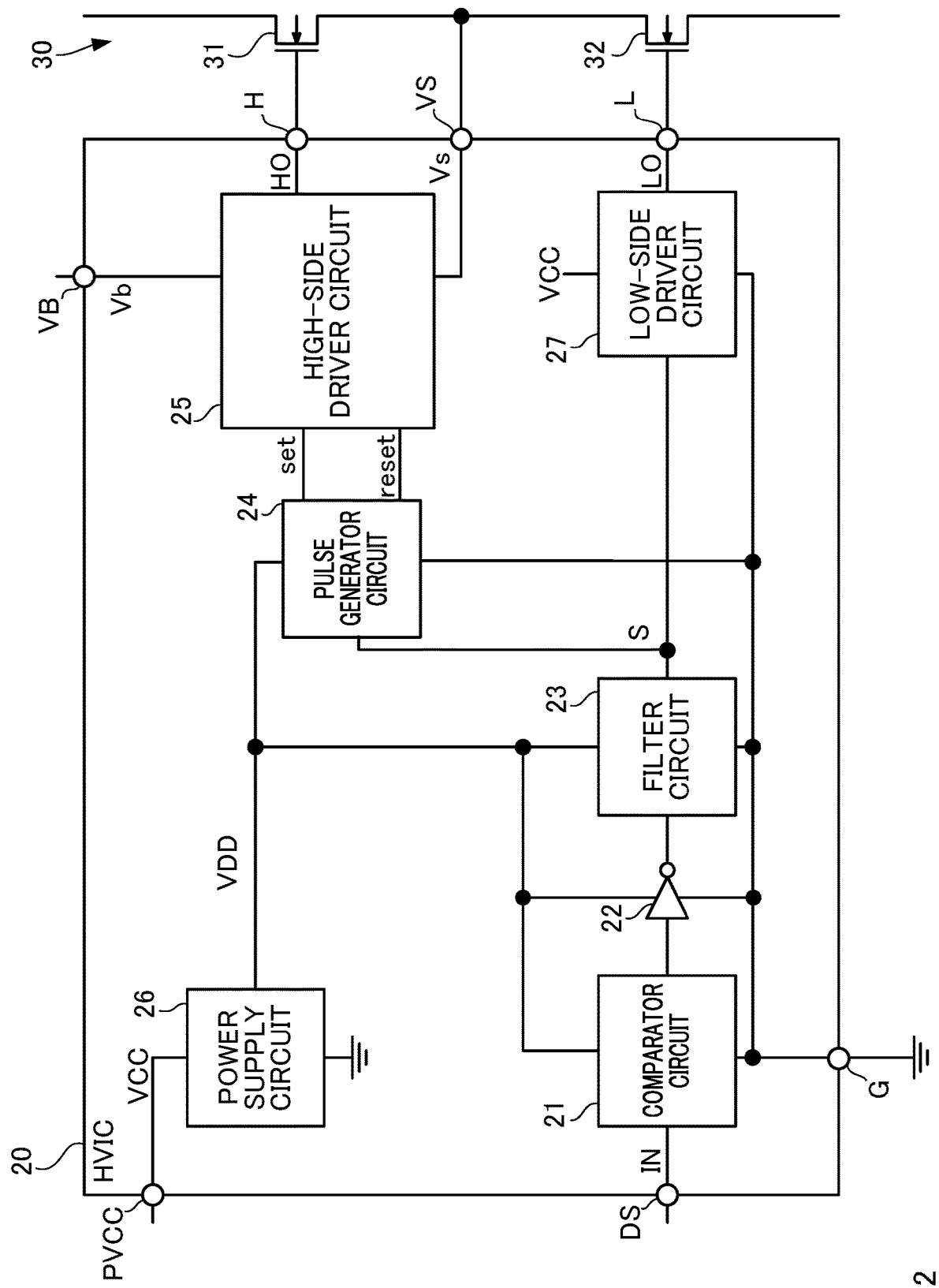
FIG. 2 is a diagram illustrating an example of a configuration of a High Voltage Integrated Circuit (HVIC) 20.

FIG. 2 is a diagram illustrating an example of a configuration of the HVIC 20. The HVIC 20 includes a comparator circuit 21, an inverter 22, a filter circuit 23, a pulse generator circuit 24, a high-side driver circuit 25, a power supply circuit 26, a low-side driver circuit 27, and terminals PVCC, DS, VB, H, VS, L, and G.

The comparator circuit 21 is an input detection circuit that detects the received control signal IN, inverts the control signal IN, and outputs a resultant signal. Note that the control signal IN varies in the range of, for example, 0 V to 15 V in an embodiment of the present disclosure. Thus, the comparator circuit 21 is configured with a high-voltage device. In addition, the control signal IN is a square wave varying between 0 V to 15 V, and the upper-arm NMOS transistor 31 is on when the control signal IN is at a high level (hereinafter referred to as high or high level), and the lower-arm NMOS transistor 32 is on when the control signal IN is at a low level (hereinafter referred to as low or low level).

The inverter 22 inverts the output of the comparator circuit 21, and outputs a resultant to the filter circuit 23.

The filter circuit 23 includes, for example, a low-pass filter (not illustrated), and outputs a signal S obtained by removing noise in the signal outputted from the inverter 22.

The pulse generator circuit 24 generates a set signal set at the rising edge of the signal S, and generates a reset signal reset at the falling edge of the signal S.

In response to the set signal set and the reset signal reset from the pulse generator circuit 24, the high-side driver circuit 25 outputs the drive signal HO through the terminal H to drive the upper-arm NMOS transistor 31.

The power supply circuit 26, which is, for example, a step-down regulator, steps down the power supply voltage VCC (e.g., 15 V) from the terminal PVCC, to thereby generate a low power supply voltage VDD (e.g., 5 V), and supplies the low power supply voltage VDD to the comparator circuit 21, the inverter 22, the filter circuit 23, and the pulse generator circuit 24.

In response to the signal S from the filter circuit 23, the low-side driver circuit 27 outputs the drive signal LO to drive the lower-arm NMOS transistor 32 through the terminal L.

Comparator Circuit 21

Comparator Circuit 21a of Embodiment of Present Disclosure

Figure 3:
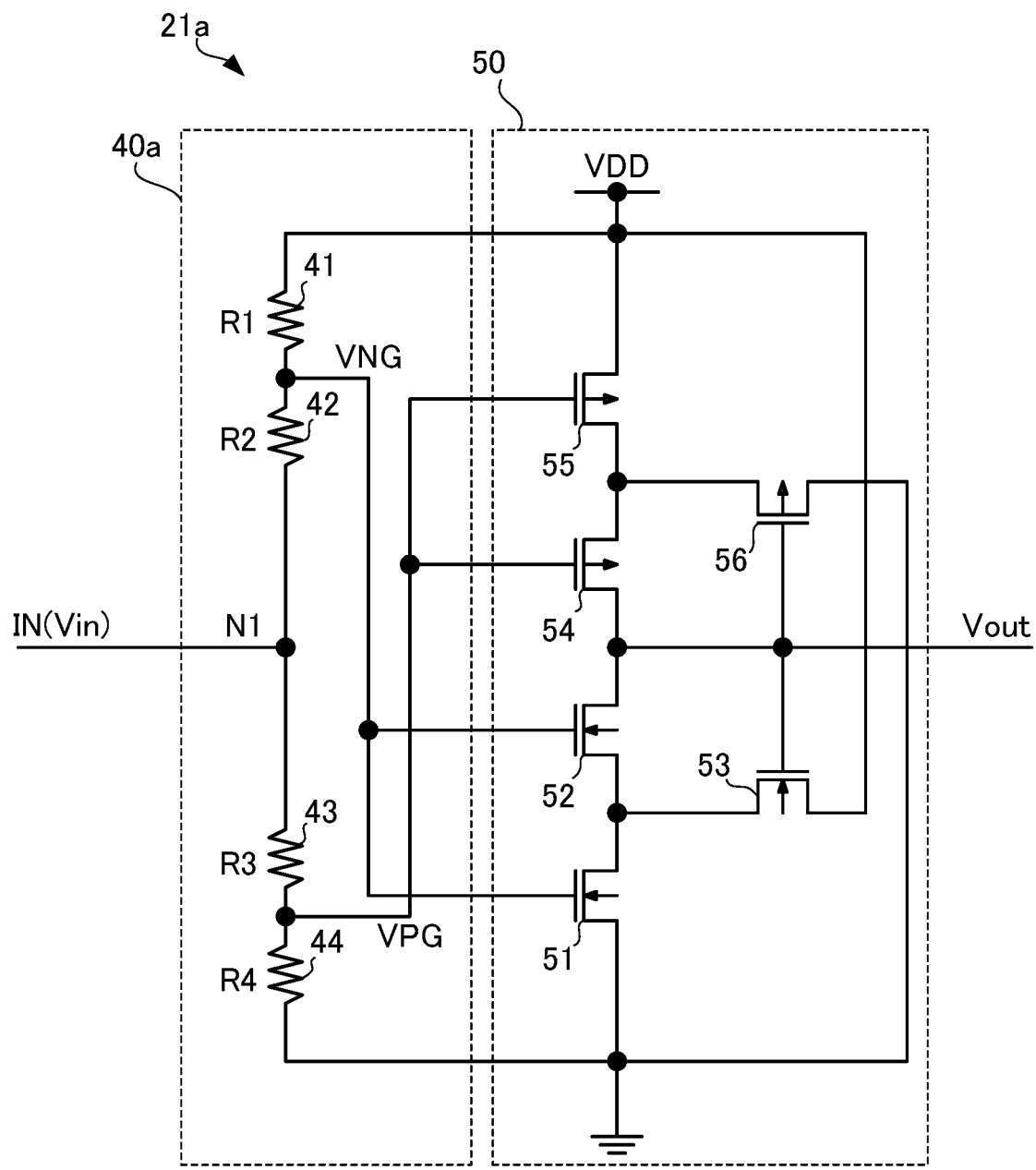
FIG. 3 is a diagram illustrating a configuration of a comparator circuit 21a which is an embodiment of a comparator circuit 21.

FIG. 3 is a diagram illustrating a configuration of a comparator circuit 21a which is one embodiment of the comparator circuit 21.

When the voltage level of the control signal IN changes from a low voltage level (e.g., 0 V) to a high voltage level (e.g., VDD) and exceeds a high threshold voltage VtH, the comparator circuit 21a changes the logic level of an output voltage Vout from high to low. Also, when the voltage level of the control signal IN changes from a high voltage level to a low voltage level and drops below a low threshold voltage VtL, the comparator circuit 21a changes the logic level of the output voltage Vout from low to high. The comparator circuit 21a includes a voltage converter circuit 40a and a logic circuit 50.

The voltage converter circuit 40a converts the voltage generated at a node N1 to which the control signal IN is inputted, into a voltage VNG and a voltage VPG lower than the voltage VNG. Hereinafter, the voltage generated at the node N1 is referred to as input voltage Vin.

The voltage converter circuit 40a includes resistors 41 to 44. The resistors 41 to 44 are coupled in series between the ground and a node to which the low power supply voltage VDD is applied. Upon application of the input voltage Vin to the node N1, the voltage converter circuit 40a generates the voltage VNG at the coupling point between the resistor 41 and the resistor 42, and generates the voltage VPG at the coupling point between the resistor 43 and the resistor 44.

The voltage VNG is applied to the gate electrodes of NMOS transistors 51, 52, which are inputs of the logic circuit 50, and the voltage VPG is applied to the gate electrodes of P-channel metal-oxide-semiconductor (PMOS) transistors 54, 55 of the logic circuit 50, which are inputs of the logic circuit 50.

The voltage VNG and the voltage VPG are calculated as follows:

$$VNG = (R1/(R1 + R2)) \times Vin + (R2/(R1 + R2)) \times VDD \quad (1)$$

$$VPG = (R4/(R3 + R4)) \times Vin \quad (2)$$

where R1, R2, R3, and R4 are the resistance values of the resistors 41 to 44, respectively.

The logic circuit 50 is a Schmitt trigger circuit that changes the logic level of the output voltage Vout with hysteresis characteristics, according to a change in the voltage levels of the voltages VNG, VPG. The logic circuit 50 includes NMOS transistors 51 to 53 and PMOS transistors 54 to 56.

The NMOS transistors 51, 52 and the PMOS transistors 54, 55 are coupled in series between a power supply node to which the low power supply voltage VDD is applied and the ground, in the order of the PMOS transistor 55, the PMOS transistor 54, the NMOS transistor 52, and the NMOS transistor 51 from the power supply side. The voltage VNG is applied to the gate electrodes of the NMOS transistors 51, 52, which are inputs of the logic circuit 50, and the voltage VPG is applied to the gate electrodes of the PMOS transistors 54, 55, which are inputs of the logic circuit 50.

The NMOS transistor 53 has a gate electrode to receive the output voltage Vout, which is outputted from the coupling point between the NMOS transistor 52 and the PMOS transistor 54, a drain terminal to receive the low power supply voltage VDD, and a source electrode coupled to the coupling point between the NMOS transistors 51 and 52.

The PMOS transistor 56 has a gate electrode to receive the output voltage Vout, a drain terminal which is grounded, and a source electrode coupled to the coupling point between the PMOS transistors 54 and 55.

Note that the maximum value of the voltage of the control signal IN is higher than the power supply voltage to the logic circuit 50. Accordingly, the NMOS transistors 51 to 53 and the PMOS transistors 54 to 56 are configured with high-voltage MOS transistors.

In addition, in an embodiment of the present disclosure, the resistance values R1 to R4 are set such that one of the pair of PMOS transistors 54, 55 and the pair of NMOS transistors 51, 52 is turned off when the input voltage Vin is not applied to the node N1.

Note that the resistors 41 to 44 correspond to the "first resistor," the "second resistor," the "third resistor," and the "fourth resistor," respectively. The voltage VNG corresponds to a "first voltage," and the voltage VPG corresponds to a "second voltage." The NMOS transistors 51, 52 correspond to "two NMOS transistors," and the PMOS transistors 54, 55 correspond to "two PMOS transistors." The logic level of the output voltage Vout corresponds to a "result of detection."

Note that the logic circuit 50 operates at the low power supply voltage VDD (e.g., 5 V) lower than the maximum value of the input voltage Vin (e.g., 15 V).

==Basic Operation of Logic Circuit 50==

Figure 4:
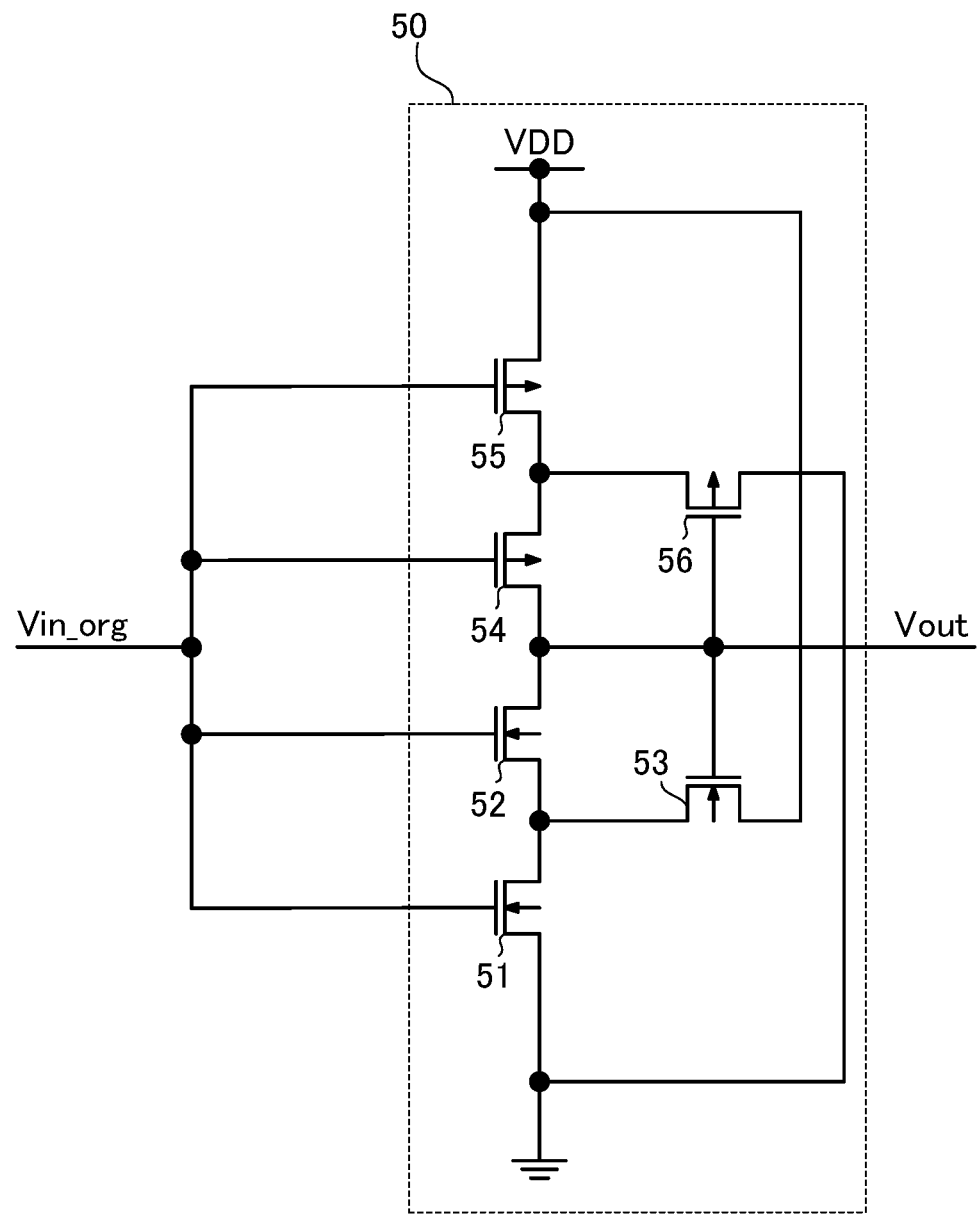
FIG. 4 is a diagram illustrating an example of a configuration of a logic circuit 50.

To describe the basic operation of a Schmitt trigger circuit, a description is first given of a circuit illustrated in FIG. 4, in which the two NMOS transistors 51, 52 and the two PMOS transistors 54, 55 of the logic circuit 50 have common gates. It is assumed here that a voltage applied to the gates of the two NMOS transistors 51, 52 and the two PMOS transistors 54, 55 of the logic circuit 50 is referred to as input voltage Vin_org.

<<Explanation of Operation of Logic Circuit 50>>

Figure 5:
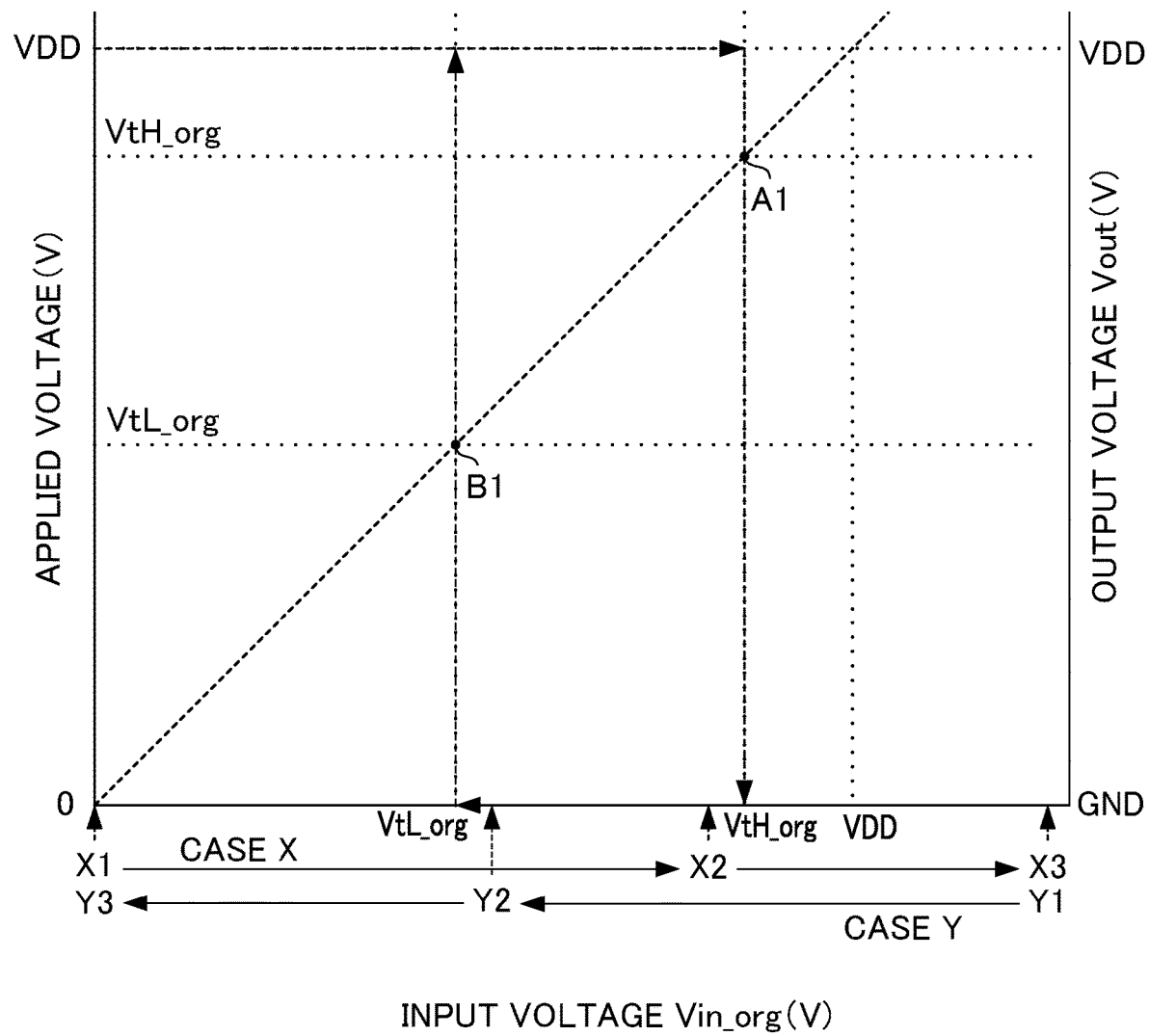
FIG. 5 is a diagram explaining an operation of a logic circuit 50.

FIG. 5 is a diagram illustrating an operation of the logic circuit 50. The operations of the NMOS transistors 51 to 53 and the PMOS transistors 54 to 56 of the logic circuit 50 will be described with reference to FIG. 5.

The dotted straight line indicates the relation between the input voltage Vin_org inputted to the logic circuit 50 and the applied voltage applied to the gate electrodes of the NMOS transistors 51, 52 and the PMOS transistors 54, 55.

First, a case X where the input voltage Vin_org changes from X1 to X3 will be described. The input voltage Vin_org is 0 V at X1. At this time, the NMOS transistors 51, 52 are off, and the NMOS transistor 53 is on. Meanwhile, the PMOS transistors 54, 55 are on, and the PMOS transistor 56 is off. Thus, the output voltage Vout results in the power supply voltage VDD.

At X2, at which the input voltage Vin_org is higher than at X1, the NMOS transistor 51 is on, the NMOS transistor 52 is off, and the NMOS transistor 53 is on. Meanwhile, the PMOS transistors 54, 55 are off, and the PMOS transistor 56 is off. Then, the output voltage Vout still remains the power supply voltage VDD because the parasitic capacitance at the node that receives the output voltage Vout remains charged.

When the input voltage Vin_org exceeds the voltage at X2, the NMOS transistors 51, 52 are on, and the NMOS transistor 53 is off. Meanwhile, the PMOS transistors 54, 55 are off, and the PMOS transistor 56 is on. At this time, the output voltage Vout changes from the power supply voltage VDD to 0 V. Accordingly, the voltage value of the input voltage Vin_org at this time reaches a high threshold voltage VtH_org. Note that when the input voltage Vin_org reaches the high threshold voltage VtH_org of the logic circuit 50, the applied voltage applied to the gate electrodes of the NMOS transistors 51, 52 reaches a voltage level indicated by the point A1 (i.e., VtH_org). At this time, the output voltage Vout changes from high to low through the point A1.

At X3, the input voltage Vin_org is a voltage (e.g., 15 V) higher than the power supply voltage VDD. At this time, the NMOS transistors 51, 52 are on, and the NMOS transistor 53 is off. Meanwhile, the PMOS transistors 54, 55 are off, and the PMOS transistor 56 is on. Thus, the output voltage Vout still remains 0 V.

Next, a case Y where the input voltage Vin_org changes from Y1 to Y3 will be described. At Y1, the input voltage Vin_org is a voltage (e.g., 15 V) higher than the power supply voltage VDD. At this time, the PMOS transistors 54, 55 are off, and the PMOS transistor 56 is on. Meanwhile, the NMOS transistors 51, 52 are on, and the NMOS transistor 53 is off. Thus, the output voltage Vout is 0 V.

At Y2, at which the input voltage Vin_org is lower than at Y1, the PMOS transistor 54 is off, the PMOS transistor 55 is on, and the PMOS transistor 56 is on. Meanwhile, the NMOS transistors 51, 52 are off, and the NMOS transistor 53 is off. Then, the output voltage Vout still remains 0 V because the parasitic capacitance at the node that receives the output voltage Vout remains discharged.

When the input voltage Vin_org drops below the voltage at Y2, the PMOS transistors 54, 55 are on, and the PMOS transistor 56 is off. Meanwhile, the NMOS transistors 51, 52 are off, and the NMOS transistor 53 is on. Thus, the output voltage Vout changes from 0V to the power supply voltage VDD. Accordingly, the voltage value of the input voltage Vin_org at this time reaches a low threshold voltage VtL_org. Note that when the input voltage Vin_org reaches the low threshold voltage VtL_org of the logic circuit 50, the applied voltage applied to the gate electrodes of the PMOS transistors 54, 55 reaches a voltage level indicated by a point B1 (i.e., VtL_org). At this time, the output voltage Vout changes from low to high through the point B1.

At Y3, the input voltage Vin_org reaches 0 V. At this time, the PMOS transistors 54, 55 are on, and the PMOS transistor 56 is off. Meanwhile, the NMOS transistors 51, 52 are off, and the NMOS transistor 53 is on. Thus, the output voltage Vout still remains the power supply voltage VDD.

Accordingly, the logic circuit 50 changes the logic level of the output voltage Vout from high to low, upon the voltage level of the input voltage Vin_org changing from a low voltage level (e.g., 0 V) to a high voltage level (e.g., VDD) and exceeding the high threshold voltage VtH_org (case X). Meanwhile, the logic circuit 50 changes the logic level of the output voltage Vout from low to high, upon the voltage level of the input voltage Vin_org changing from a high voltage level to a low voltage level and dropping below the low threshold voltage VtL_org (case Y).

<<Calculation of Threshold Voltages of Logic Circuit 50>>

As has been described above, the logic circuit 50 has hysteresis characteristics implemented with the high threshold voltage VtH_org and the low threshold voltage VtL_org. The high threshold voltage VtH_org is determined based on the conditions under which both the NMOS transistors 51 and 52 are on. The low threshold voltage VtL_org is determined based on the conditions under which both the PMOS transistors 54 and 55 are on.

In other words, the high threshold voltage VtH_org is determined based on a threshold voltage vtn of each of the NMOS transistors 51, 52, and the low threshold voltage VtL_org is determined based on a threshold voltage vtp of each of the PMOS transistors 54, 55.

It is assumed here that the PMOS transistors 54, 55 have the common threshold voltage vtp, but may have different threshold voltages instead. The same applies to the threshold voltage vtn of the NMOS transistors 51, 52.

The following describes how the high threshold voltage VtH_org is determined by the threshold voltage vtn. The following also describes how the low threshold voltage VtL_org is determined by the threshold voltage vtp.

First, to express the high threshold voltage VtH_org with the threshold voltage vtn, a description will be given of a case where the input voltage Vin changes from a low voltage (e.g., 0 V) to a high voltage (e.g., VDD).

The following describes using the circuit including the NMOS transistors 51 to 53 in the logic circuit 50 in FIG. 4. Gate-source voltages VGS51, VGS52, VGS53 of the NMOS transistors 51, 52, 53, respectively, are expressed as follows:

$$VGS51 = \text{Vin\_org} \quad (3)$$

$$VGS52 = \text{Vin\_org} - Vx \quad (4)$$

$$VGS53 = Vout - Vx \quad (5)$$

where Vx is the voltage at the coupling point between the NMOS transistor 51 and the NMOS transistor 52.

When the input voltage Vin_org is 0 V at X1 in FIG. 5, the NMOS transistors 51, 52 are off, and the NMOS transistor 53 is on.

When the input voltage Vin approaches the threshold voltage vtn of the NMOS transistor 51, the NMOS transistor 51 is turned on. Then, a drain current flowing to the NMOS transistor 53 and a drain current flowing to the NMOS transistor 51 become equal.

In this case, the following Formula (6) holds:

$$\beta 3 \times (VDD - Vx - vtn) \wedge 2/2 = \beta 1 \times (\text{Vin\_org} - vtn) \wedge 2/2 \quad (6)$$

where β1 and β3 are coefficients determined by the physical structures of the NMOS transistors 51, 53, respectively. For instance, β=μCoxW/L, where μ is a mobility, Cox is the capacitance per unit area of a gate oxide film, W is a gate width, and L is a gate length.

When Formula (6) is rearranged to obtain the voltage Vx the following formula is given:

$$Vx = VDD + (\sqrt{(\beta 1/\beta 3)} - 1) \times vtn - \sqrt{(\beta 1/\beta 3)} \times \text{Vin\_org} \quad (7)$$

Upon the input voltage Vin rising to the high threshold voltage VtH_org resulting in VGS52=Vin_org−Vx=vtn, the NMOS transistor 52 is turned on. Because the NMOS transistors 51, 52 are on, the output voltage Vout is 0 V. Assuming that the input voltage Vin_org at this time is VtH_org, the following Formula (8) holds:

$$\text{VtH\_org} - VDD - (\sqrt{(\beta 3/\beta 1)} - 1) \times vtn + \sqrt{(\beta 3/\beta 1)} \times \text{VtH\_org} = vtn. \quad (8)$$

When VtH_org is obtained from Formula (8), the following Formula (9) holds:

$$\text{VtH\_org} = (VDD + \sqrt{(\beta 1/\beta 3)} \times vtn)/(1 + \sqrt{(\beta 1/\beta 3)}) = \quad (9)$$
$$(\sqrt{(\beta 3/\beta 1)} \times VDD + vtn)/(1 + \sqrt{(\beta 3/\beta 1)}).$$

Note that when the NMOS transistors 51, 52 are on, the NMOS transistor 53 is turned off because Vx=Vout=0 and VGS53=0.

Next, to express the low threshold voltage VtL_org with the threshold voltage vtp, a description will be given of a case where the input voltage Vin_org changes from a high voltage to a low voltage. It is assumed here that the threshold voltage vtp is a negative value.

The following describes using the circuit including the PMOS transistors 54 to 56 in the logic circuit 50 in FIG. 4. Gate-source voltages VGS54, VGS55, VGS56 of the PMOS transistors 54 to 56, respectively, are expressed as follows:

$$VGS54 = \text{Vin\_org} - Vy \quad (10)$$

$$VGS55 = \text{Vin\_org} - VDD \quad (11)$$

$$VGS56 = Vout - Vy \quad (12)$$

where Vy is the voltage at the coupling point between the PMOS transistor 54 and the PMOS transistor 55.

When the input voltage Vin_org is VDD, the PMOS transistors 54, 55 are off, and the PMOS transistor 56 is on. At this time, Vout=0, and Vy=vtp.

When the input voltage Vin_org approaches VDD+vtp, the PMOS transistor 55 is turned on. Then, a drain current flowing to the PMOS transistor 56 and a drain current flowing to the PMOS transistor 55 become equal.

In this case, the following Formula (13) holds:

$$\beta 5 \times (\text{Vin\_org} - VDD - vtp) \wedge 2/2 = \beta 6 \times (-Vy - vtp) \wedge 2/2 \quad (13)$$

where β5 and β6 are coefficients determined by the physical structures of the PMOS transistors 55, 56, respectively. For instance, β=μCoxW/L, where μ is a mobility, Cox is the capacitance per unit area of a gate oxide film, W is a gate width, and L is a gate length.

When Formula (13) is rearranged to obtain the voltage Vy, the following is given:

$$Vy = \sqrt{(\beta 5/\beta 6)} \times VDD + (\sqrt{(\beta 5/\beta 6)} - 1) \times vtp - \sqrt{(\beta 5/\beta 6)} \times \text{Vin\_org} \quad (14)$$

When the input voltage Vin_org drops to a lower voltage resulting in VGS54=Vin_org−Vy=vtp, the PMOS transistor 54 is turned on. Since the PMOS transistors 54, 55 are on, the output voltage Vout results in VDD. Assuming that the input voltage Vin_org is VtL_org, the following Formula (15) holds:

$$\text{VtL\_org} = \sqrt{(\beta 5/\beta 6)} \times VDD - \quad (15)$$
$$(\sqrt{(\beta 5/\beta 6)} - 1) \times vtp + \sqrt{(\beta 5/\beta 6)} \times \text{VtL\_org} = vtp.$$

When VtL_org is obtained from Formula (15), the following Formula (16) holds:

$$\text{VtL\_org} = (\sqrt{(\beta 5/\beta 6)} \times VDD + \sqrt{(\beta 5/\beta 6)} \times vtp)/(1 + \sqrt{(\beta 5/\beta 6)}) = \quad (16)$$
$$(VDD + vtp)/(1 + \sqrt{(\beta 6/\beta 5)}).$$

Note that when the PMOS transistors 54, 55 are on, the PMOS transistor 56 is turned off because Vy=Vout=VDD and VGS56=0.

As has been described above, the high threshold voltage VtH_org is a voltage according to the threshold voltage vtn of each of the NMOS transistors 51, 52, and the low threshold voltage VtL_org is a voltage according to the threshold voltage vtp of each of the PMOS transistors 54, 55.
<<Calculation of Threshold Voltages of Comparator Circuit 21*a*>>

In the comparator circuit 21*a*, the voltage VNG is applied to the gate electrodes of the NMOS transistors 51, 52, and the voltage VPG is applied to the gate electrodes of the PMOS transistors 54, 55.

Accordingly, when the voltage VNG changes from a low voltage to a high voltage and exceeds the high threshold voltage VtH_org, the logic level of the output voltage Vout changes from high to low. Similarly, when the voltage VPG changes from a high voltage to a low voltage and drops below the low threshold voltage VtL_org, the logic level of the output voltage Vout changes from low to high.

Thus, when the high threshold voltage VtH_org of the logic circuit 50 is applied to the logic circuit 50 and the voltage level of the control signal IN to the comparator circuit 21*a* is at the threshold voltage VtH as the input voltage Vin, the high threshold voltage VtH_org is expressed based on Formula (1) as follows:

$$VtH\_org = (R1/(R1+R2)) \times VtH + (R2/(R1+R2)) \times VDD. \quad (17)$$

To obtain the high threshold voltage VtH from Formula (17), the following formula is given:

$$VtH = ((R1+R2)/R1) \times VtH\_org - (R2/R1) \times VDD. \quad (18)$$

Similarly, when the low threshold voltage VtL_org of the logic circuit 50 is applied to the logic circuit 50 and the voltage level of the control signal IN to the comparator circuit 21*a* is at the threshold voltage VtL as the input voltage Vin, the low threshold voltage VtL_org is expressed based on Formula (2) as follows:

$$VtL\_org = (R4/(R3+R4)) \times VtL. \quad (19)$$

To obtain the low threshold voltage VtL from Formula (19), the following formula is given:

$$VtL = ((R3+R4)/R4) \times VtL\_org. \quad (20)$$

As has been described above, the high threshold voltage VtH and the low threshold voltage VtL of the comparator circuit 21*a* can be set to values different from the high threshold voltage VtH_org and the low threshold voltage VtL_org of the logic circuit 50. Then, with the use of the comparator circuit 21*a*, it is possible to change the high threshold voltage VtH and the low threshold voltage VtL of the comparator circuit 21*a* by changing the resistance values R1 to R4 of the resistors 41 to 44. Accordingly, the hysteresis characteristics of the logic circuit 50 can be changed.

In addition, the resistance values R3, R4 of the resistors 43, 44 are designed such that when the input voltage Vin rises to the high threshold voltage VtH of the comparator circuit 21*a*, the voltage VPG will become higher than the low threshold voltage VtL_org. Meanwhile, the resistance values R1 to R4 of the resistors 41 to 44 are designed such that when the input voltage Vin drops to the low threshold voltage VtL of the comparator circuit 21*a*, the voltage VNG will become lower than the high threshold voltage VtH_org.

Accordingly, even if the input voltage Vin changes, the NMOS transistors 51 to 53 and the PMOS transistors 54 to 56 operate as described in Explanation of Operation of Logic Circuit 50.

Note that the low level and low may correspond to the "first logic level," and the high level and high may correspond to the "second logic level," and conversely, the high level and high may correspond to the first logic level," and the low level and low may correspond to the "second logic level."

<<Comparison of Input/Output Characteristics Between Comparator Circuit 21*a* and Logic Circuit 50>>

Figure 6:
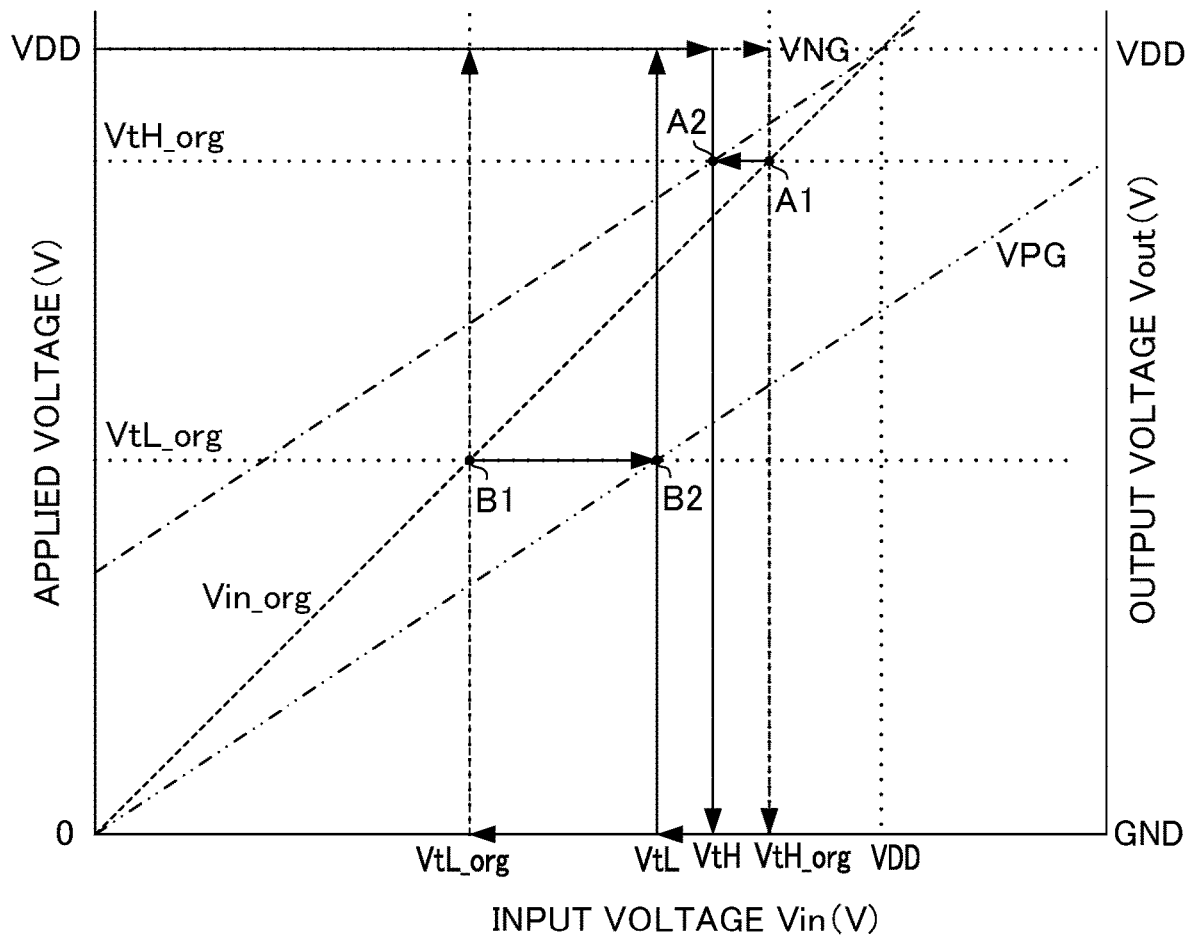
FIG. 6 is a diagram illustrating how thresholds change when a comparator circuit 21a is used.

FIG. 6 is a diagram illustrating how thresholds change when the comparator circuit 21*a* is used. The dotted straight line in FIG. 6 indicates the relation between the input voltage Vin_org inputted to the logic circuit 50 in FIG. 4 and the applied voltage applied to the gate electrodes of the NMOS transistors 51, 52 and the PMOS transistors 54, 55.

The dash-dot straight line indicates a change in the voltage VNG with respect to the input voltage Vin inputted to the comparator circuit 21*a*. In other words, the dash-dot straight line indicates a change in the applied voltage applied to the gate electrodes of the NMOS transistors 51, 52, with respect to the input voltage Vin.

The dash-dot-dot straight line indicates a change in the voltage VPG with respect to the input voltage Vin inputted to the comparator circuit 21*a*. In other words, the dash-dot-dot straight line indicates a change in the applied voltage applied to the gate electrodes of the PMOS transistors 54, 55, with respect to the input voltage Vin. However, the straight lines of the voltages VNG, VPG each are merely an example in a case where the relation among the resistance values R1 to R4 of the resistors 41 to 44 is R2:R1=R3:R4=1:2.

The following describes the relation between the input voltage Vin to the comparator circuit 21*a* and the high threshold voltage VtH and the low threshold voltage VtL of the comparator circuit 21*a*.

First, when the input voltage Vin changes from a low voltage (e.g., 0 V) to a high voltage (e.g., VDD), and the voltage VNG reaches a voltage level indicated by the point A2, which is the same as the voltage level indicated by the point A1 (i.e., VtH_org), the logic level of the output voltage Vout changes from high to low as indicated by the solid line passing through the point A2. Accordingly, when the voltage level of the voltage VNG reaches the point A2, the input voltage Vin reaches the high threshold voltage VtH of the comparator circuit 21*a*.

Next, when the input voltage Vin changes from a high voltage to a low voltage, and the voltage VPG reaches the voltage level indicated by a point B2, which is the same as the voltage level indicated by the point B1 (i.e., VtL_org), the logic level of the output voltage Vout changes from low to high as indicated by the solid line passing through the point B2. Accordingly, when the voltage level of the voltage VPG reaches the point B2, the input voltage Vin reaches the low threshold voltage VtL of the comparator circuit 21*a*.

In this way, the comparator circuit 21*a* applies the voltages VNG, VPG generated by the voltage converter circuit 40*a* to the NMOS transistors 51, 52 and the PMOS transistors 54, 55. This enables the comparator circuit 21*a* to change the high threshold voltage VtH_org and the low threshold voltage VtL_org determined by the thresholds of the MOS transistors into the high threshold voltage VtH and the low threshold voltage VtL of the comparator circuit 21a. Accordingly, the comparator circuit 21a can change the hysteresis characteristics of the logic circuit 50.

In addition, as indicated by Formulae (9) and (16) given above, the value of the high threshold voltage VtH_org is dependent on a voltage according to the threshold voltage vtn of each of the NMOS transistors 51, 52, and the value of the low threshold voltage VtL_org is dependent on a voltage according to the threshold voltage vtp of each of the PMOS transistors 54, 55. Those having thresholds that are low can be used, and in such a case, the hysteresis characteristics can be changed.

In addition, an embodiment of the present disclosure uses one in FIG. 4 as the logic circuit 50. A hysteresis comparator capable of changing the hysteresis width and the thresholds for changing the logic level from high to low and from low to high needs to use a plurality of differential amplifiers. Differential amplifiers need a large area and need a bias current to keep flowing while operating, thereby increasing power consumption. When the output of the logic circuit 50 is stable at the high level, the NMOS transistors 51, 52 are off, and thus no through current flows in the logic circuit 50. Likewise, when the output of the logic circuit 50 is stable at the low level, the PMOS transistors 54, 55 are off, and thus no through current flows in the logic circuit 50. Accordingly, the current consumption is small except when the output is switched, and thus the power consumption can be reduced.

===Modifications===

==Comparator Circuit 21b==

Figure 7:
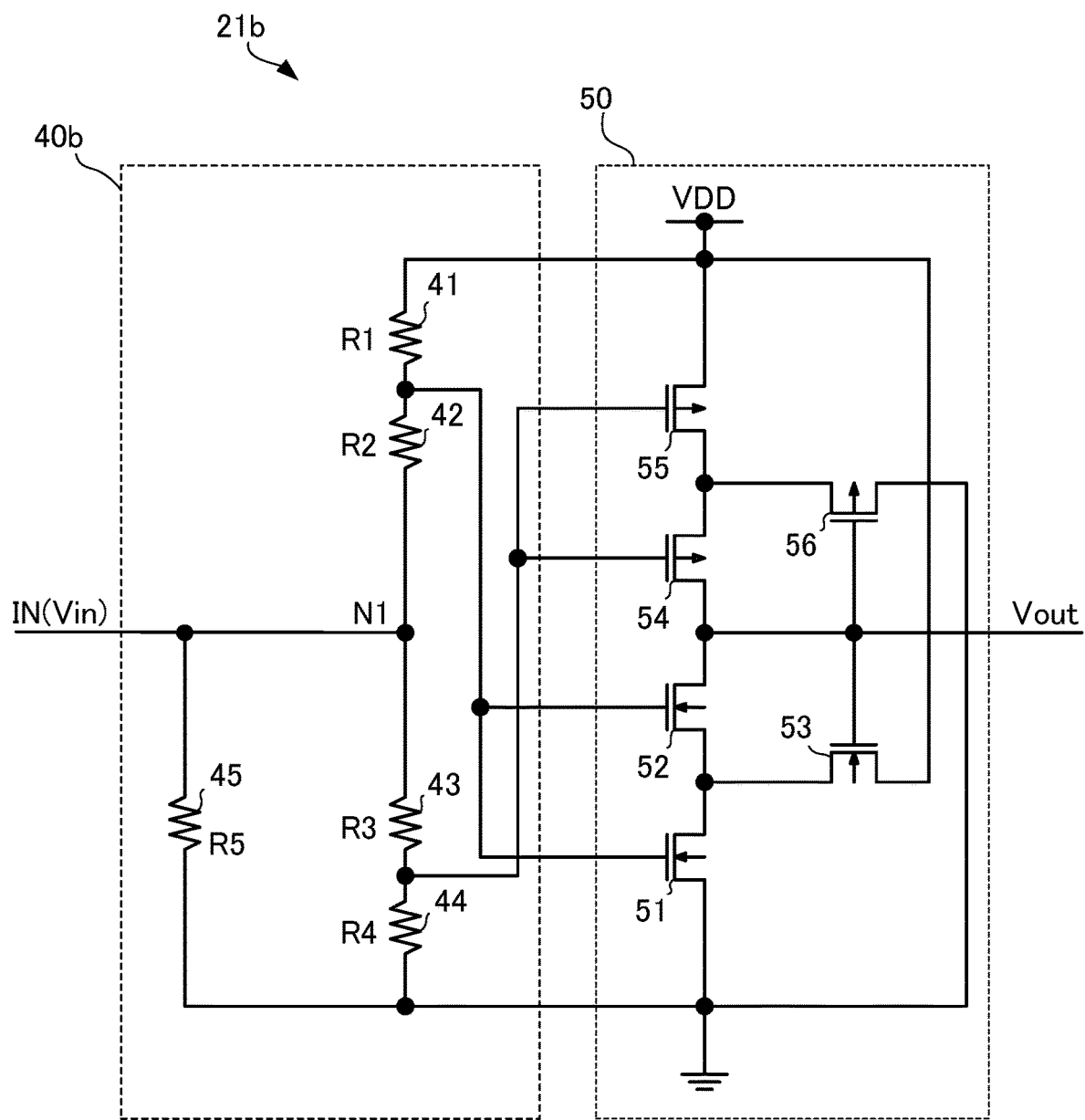
FIG. 7 is a diagram illustrating an example of a configuration of a comparator circuit 21b.

FIG. 7 is a diagram illustrating an example of a configuration of a comparator circuit 21b. A voltage converter circuit 40b of the comparator circuit 21b is obtained by further adding a resistor 45 between the ground and the node to which the input voltage is applied, to the voltage converter circuit 40a of the comparator circuit 21a.

==Comparator Circuit 21c==

Figure 8:
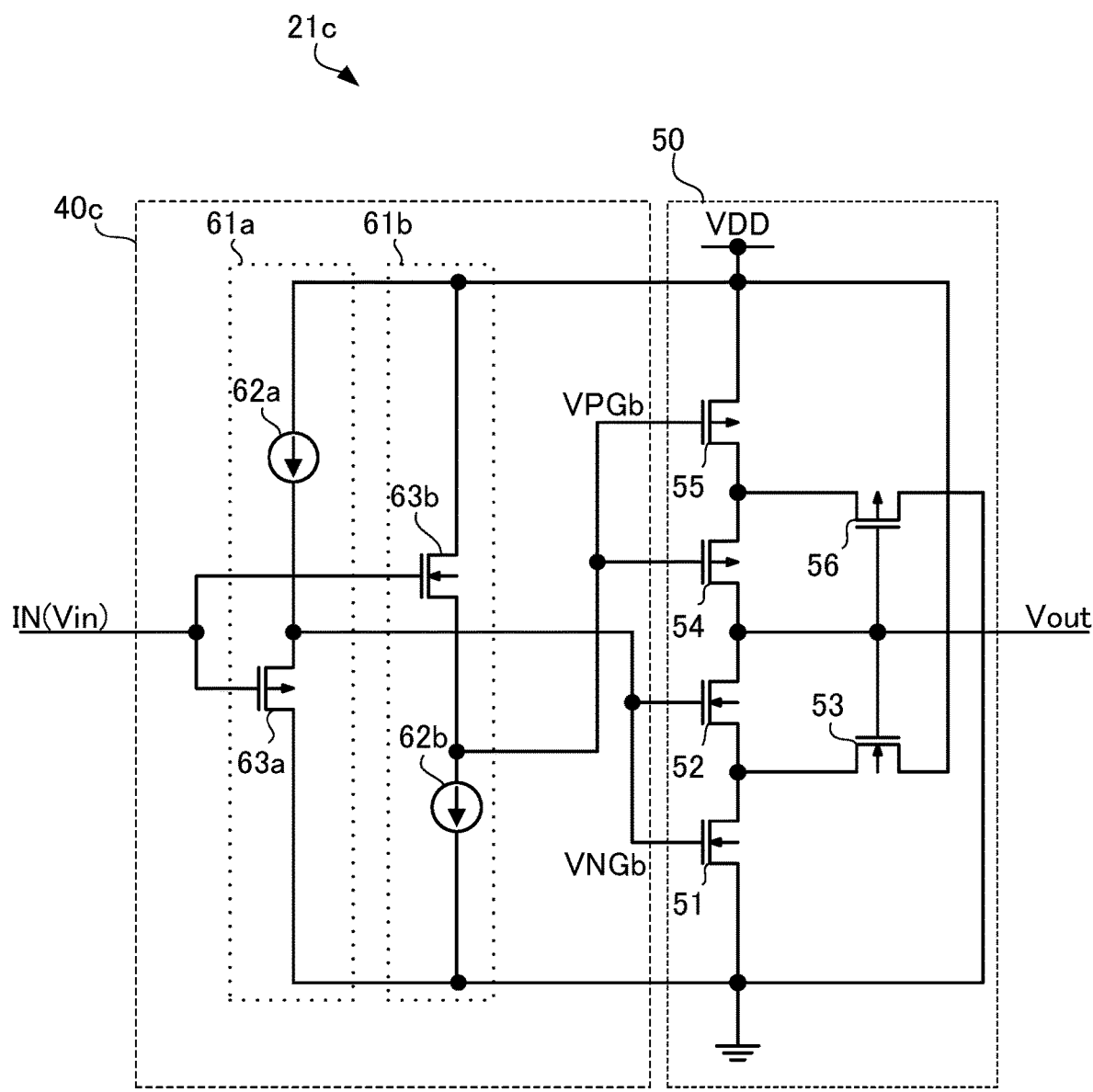
FIG. 8 is a diagram illustrating an example of a configuration of a comparator circuit 21c.

FIG. 8 is a diagram illustrating an example of a configuration of a comparator circuit 21c. The voltage converter circuit may be implemented in a configuration different from the configurations of the voltage converter circuits 40a, 40b. In one example, a voltage converter circuit 40c is configured with a source follower circuit 61a including a PMOS transistor 63a having a gate electrode to receive the input voltage Vin and a source electrode from which a voltage VNGb is outputted, and a source follower circuit 61b including an NMOS transistor 63b having a gate electrode to receive the input voltage Vin and a source electrode from which a voltage VPGb is outputted.

The source follower circuit 61a includes a constant current source 62a and the PMOS transistor 63a. The source follower circuit 61b includes a constant current source 62b and the NMOS transistor 63b.

Note that the source follower circuit 61a corresponds to the "first source follower circuit," and the source follower circuit 61b corresponds to the "second source follower circuit."

The voltage VNGb, which is an output from the source follower circuit 61a, is basically obtained by shifting the input voltage Vin by an amount of the gate-source voltage of the PMOS transistor 63a. Likewise, the voltage VPGb, which is an output from the source follower circuit 61b, is obtained by shifting the input voltage Vin by an amount of the gate-source voltage of the NMOS transistor 63b.

However, due to the nature of the source follower circuit, the input voltage Vin is outputted after cutting off a part thereof outside an output amplitude obtained by subtracting an amount corresponding to a drop in the voltage used by the constant current source and the transistor. Accordingly, the amplitude of the voltage VNGb or the amplitude of the voltage VPGb is smaller than the potential difference between the low power supply voltage VDD and the ground voltage.

The voltage converter circuit 40c receives the input voltage Vin and thus needs to have high-voltage devices. However, the voltage VNGb and the voltage VPGb which are outputs of the source follower circuits that operate at the low power supply voltage VDD have amplitudes that are smaller than or equal to the potential difference between the ground voltage and the low power supply voltage VDD. Thus, even without using high-voltage devices in the comparator circuit 21a, the devices can be prevented from being broken. Accordingly, in a modification of the present disclosure, the voltage converter circuit 40c uses high-voltage devices, and the logic circuit 50 that operates at the potential difference between the low power supply voltage VDD and the ground voltage uses low-voltage devices.

Summary

The power module 10 according to an embodiment of the present disclosure has been described hereinabove. When a Schmitt trigger circuit is used as the comparator circuit 21, the hysteresis characteristics are determined by the threshold voltages of the NMOS transistors 51, 52 and the PMOS transistors 54, 55 and are difficult to be changed. However, the input voltage Vin is converted into the voltage VNG and the voltage VPG, and the voltage VNG is applied to the gate electrodes of the NMOS transistors 51, 52 and the voltage VPG is applied to the gate electrodes of the PMOS transistors 54, 55, thereby being able to change the hysteresis characteristics seen from the input voltage Vin.

In addition, the input voltage Vin is higher than the power supply voltage VDD to the logic circuit 50, and high-voltage MOS transistors are used for the NMOS transistors 51 to 53 and the PMOS transistors 54 to 56. Then, with the use of the logic circuit 50, the hysteresis characteristics determined by the thresholds of the high-voltage MOS transistors can be changed by adjustments to the resistance values R1 to R4 of the resistors 41 to 44.

In addition, in an embodiment of the present disclosure, when the NMOS transistor 32 is turned on by the low-side driver circuit 27, a voltage Vs at the terminal VS may become negative due to the influence of an inductor component of the load 11. Then, a current flows from the ground to a voltage line that receives the voltage Vs at the terminal VS, and the potential at the terminal G (e.g., ground) may fluctuate. This may cause the low power supply voltage VDD to fluctuate. With the logic circuit 50 being configured with two PMOS transistors and two NMOS transistors, it is possible to remove the influence of the fluctuation in a bias current caused by the fluctuation of the low power supply voltage VDD when the comparator is used as a Schmitt trigger circuit. Accordingly, the logic circuit 50 operates as a Schmitt trigger circuit with high precision.

In addition, with the voltage converter circuit 40a being configured with the resistors 41 to 44, it is possible to generate voltages VNG, VPG with high precision.

In addition, the resistance values R1 to R4 of the resistors 41 to 44 are determined such that either the pair of PMOS transistors 54, 55 or the pair of NMOS transistors 51, 52 in the logic circuit 50 is turned off. This can prevent a through current from flowing in the logic circuit 50 even if the input voltage Vin is not applied to the node N1.

In addition, the voltage converter circuit 40c is implemented with two source follower circuits. This makes it possible to change the hysteresis characteristics seen from the input voltage Vin, as with the case of the logic circuit 50.

In addition, with the resistor 45 being coupled between the node N1 and the ground, it is possible to pull down the voltage at the node N1 when the input voltage Vin is not applied to the node N1. This makes it possible to design the resistance values R1 to R4 of the resistors 41 to 44 freely to a certain degree.

The present disclosure can provide a comparator circuit capable of changing the hysteresis characteristics.

Embodiments of the present disclosure described above are simply to facilitate understanding of the present disclosure and are not in any way to be construed as limiting the present disclosure. The present disclosure may variously be changed or altered without departing from its essential features and encompass equivalents thereof.

What is claimed is:

1. A comparator circuit configured to
output an output voltage at a first logic level, upon an input voltage exceeding a first threshold voltage, and
output the output voltage at a second logic level, upon the input voltage dropping below a second threshold voltage lower than the first threshold voltage,
the comparator circuit comprising:
a converter circuit configured to convert the input voltage of the comparator circuit into a first voltage and a second voltage lower than the first voltage; and
a logic circuit configured to output a voltage, as the output voltage of the comparator circuit, that is
at the first logic level, upon the first voltage exceeding a third threshold voltage, and
at the second logic level, upon the second voltage dropping below a fourth threshold voltage lower than the third threshold voltage, wherein
the logic circuit is a Schmitt trigger circuit including
two P-channel metal-oxide semiconductor (PMOS) transistors on a power supply side thereof, the two PMOS transistors being coupled in series and each having a gate electrode to receive the second voltage, and
two N-channel metal-oxide semiconductor (NMOS) transistors coupled in series between a ground and the two PMOS transistors, the two NMOS transistors each having a gate electrode to receive the first voltage, wherein
the logic circuit uses a ground voltage of the ground and a predetermined voltage of the power supply side as a power supply voltage, and
when the input voltage is a voltage between the ground voltage and the predetermined voltage, the first voltage is higher than the second voltage.

2. The comparator circuit according to claim 1, wherein the logic circuit operates at a power supply voltage lower than a maximum value of the input voltage.

3. The comparator circuit according to claim 1, wherein the third threshold voltage corresponds to a threshold voltage of each of the two NMOS transistors, and
the fourth threshold voltage corresponds to a threshold voltage of each of the two PMOS transistors.

4. The comparator circuit according to claim 3, wherein the converter circuit includes first to fourth resistors coupled in series between the ground and a node to which a power supply voltage to the logic circuit is applied, and
the converter circuit receives the input voltage of the comparator circuit at a coupling point between the second resistor and the third resistor, to thereby generate the first voltage at a coupling point between the first resistor and the second resistor, and generate the second voltage at a coupling point between the third resistor and the fourth resistor.

5. The comparator circuit according to claim 4, wherein the first to fourth resistors have resistance values such that either the two PMOS transistors, or the two NMOS transistors, are turned off when the input voltage of the comparator circuit is not received by the converter circuit.

6. The comparator circuit according to claim 1, wherein the converter circuit includes
a first source follower circuit having
a gate electrode to receive the input voltage of the comparator circuit, and
a source electrode from which the first voltage is outputted, and
a second source follower circuit having
a gate electrode to receive the input voltage of the comparator circuit, and
a source electrode from which the second voltage is outputted.

7. The comparator circuit according to claim 1, wherein the converter circuit includes a resistor coupled between a ground and a node at which the input voltage of the comparator circuit is received.

8. A semiconductor device for a power module including an upper-arm switching device and a lower-arm switching device, the semiconductor device comprising:
a power supply circuit configured to generate, from a power supply voltage, a low power supply voltage lower than the power supply voltage;
a detection circuit configured to operate at the low power supply voltage and to receive a control signal for driving the upper-arm switching device and the lower-arm switching device; and
a driver circuit configured to drive the upper-arm switching device and the lower-arm switching device in response to a result of detection of the detection circuit, wherein
the detection circuit includes a comparator circuit configured to
output the result of detection at a first logic level, upon a voltage level of the control signal exceeding a first threshold voltage, and
output the result of detection at a second logic level, upon the voltage level of the control signal dropping below a second threshold voltage lower than the first threshold voltage,
the comparator circuit including
a converter circuit configured to convert the voltage level of the control signal into a first voltage and a second voltage lower than the first voltage, and
a logic circuit configured to output a voltage, as the result of detection, that is
at the first logic level, upon the first voltage exceeding a third threshold voltage, and at the second logic level, upon the second voltage dropping below a fourth threshold voltage lower than the third threshold voltage.

\* \* \* \* \*